United States Patent [19]
Cheng

[11] Patent Number: 5,885,403
[45] Date of Patent: Mar. 23, 1999

[54] SYSTEM FOR CLEANING AND ETCHING

[75] Inventor: Wan-Li Cheng, Hsinchu, Taiwan

[73] Assignee: Vanguard Semiconductor Corporation, Taipei, Taiwan

[21] Appl. No.: 716,564

[22] Filed: Sep. 18, 1996

[30] Foreign Application Priority Data

Jul. 10, 1996 [TW] Taiwan .................................. 85210491

[51] Int. Cl.⁶ .................................................. C23F 1/00
[52] U.S. Cl. .......................................................... 156/345
[58] Field of Search ........................... 156/345; 134/902, 134/26, 3

[56] References Cited

U.S. PATENT DOCUMENTS 4,325,746 4/1982 Popplewell et al. ...................... 134/10
5,261,431 11/1993 Ueno et al. ................................ 134/66
5,361,787 11/1994 Miyazaki et al. .......................... 134/57

FOREIGN PATENT DOCUMENTS 42 01 811 11/1992 Germany .

Primary Examiner—Marian C. Knode
Assistant Examiner—Brenda G. Brumback
Attorney, Agent, or Firm—Rabin & Champagne, P.C.

[57] ABSTRACT

A system for cleaning and etching a wafer. The system includes few buffer tanks to complete the cleaning and etching process. The system further includes a loader for loading the wafer, each buffer tank storing a unique chemical solution. At least one process tank is provided for retaining the loaded wafer, and is coupled to the buffer tank to receive the chemical solution from said buffer tank and to perform the cleaning and etching of the wafer.

5 Claims, 4 Drawing Sheets

SYSTEM FOR CLEANING AND ETCHING

BACKGROUND OF THE INVENTION

1. Field of the Invention

The invention relates in general to a system for cleaning and etching wafers, and more particularly to a system for cleaning and etching, that does not need to clamp wafers frequently and saves space.

2. Description of the Related Art

Wet etching is the earliest etching technique that has been used. It removes thin film that is not covered by photoresist, using the chemical reaction between the thin film and a chemical solution. It has the benefits of simplicity and high throughput.

A conventional wet etching process is shown in FIG. 1. It uses a loader 1, a plurality of process tanks, quick drain clean tanks, a dryer 8, and an unloader 9. The quick drain clean tanks here are QDR (quick down rinse) tanks. First, wafers are loaded by the loader 1 and clamped by a robot, and then sequentially soaked in and taken out from the process tanks and quick drain clean tanks in order to perform chemical reactions with chemical solutions. For example, wafers are put into a hydrogen fluoric acid (FF) tank 2. After a predetermined period, these wafers are taken out from tank 2 and put into QDR tank 3 to be washed by deionized water (DI water) to remove residual chemical solution. Then wafers are taken out from tank 3 and put into another process tank 4 with a chemical solution such as a mixture of sulfuric acid and hydrogen peroxide (SPM) or mixture of hydrochloric acid and hydrogen peroxide (HPM). If the chemical solution contains fluorine, it must be stored in a tank made of materials that resist strong acid and corrosion, such as polytetrafluorethylene. If the chemical solution does not contain fluorine, it can be stored in a tank made of conventional materials, such as quartz. As shown in FIG. 1, after being processed through HF tank 2, QDR tank 3, SPM tank 4, QDR tank 5, HPM tank 6 and QDR tank 7, the wafers are dried by a dryer 8, and then moved out to the next process stage by an unloader 9.

There are some deficiencies in the conventional wet etch process. For example, it requires many tanks, which take up considerable space. Moreover, too many wafer movement steps result in chuck miss, e.g. dropping of wafers, and induces formation of particles on the wafers. These deficiencies lead to defects and increased cost.

SUMMARY OF THE INVENTION

It is therefore an object of the invention to provide a system for cleaning and etching wafers, that uses a few buffer tanks to complete the cleaning and etching process.

Another object of the invention is to provide a system for cleaning and etching wafers, that does not need to clamp wafers frequently.

The invention achieves the above-identified objects by providing a system for cleaning and etching a wafer. The system includes a loader for loading the wafer, at least one buffer tank that stores one kind of chemical solution, and at least one process tank for retaining the loaded wafer. The process tank is coupled to the buffer tank to receive the chemical solution from the buffer tank and to perform the cleaning and etching of the wafer.

BRIEF DESCRIPTION OF THE DRAWINGS

Other objects, features, and advantages of the invention will become apparent from the following detailed description of the preferred but non-limiting embodiment. The description is made with reference to the accompanying drawings in which.

DESCRIPTION OF THE PREFERRED EMBODIMENT

Figure 1:
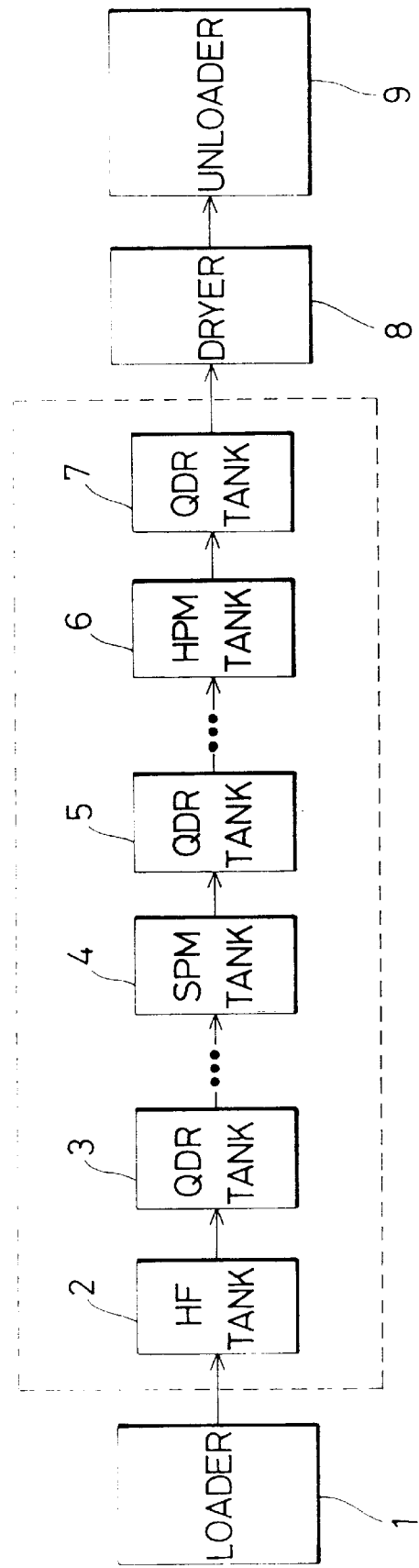
FIG. 1 is a flowchart illustrating a conventional process of cleaning and etching wafers.
Figure 2:
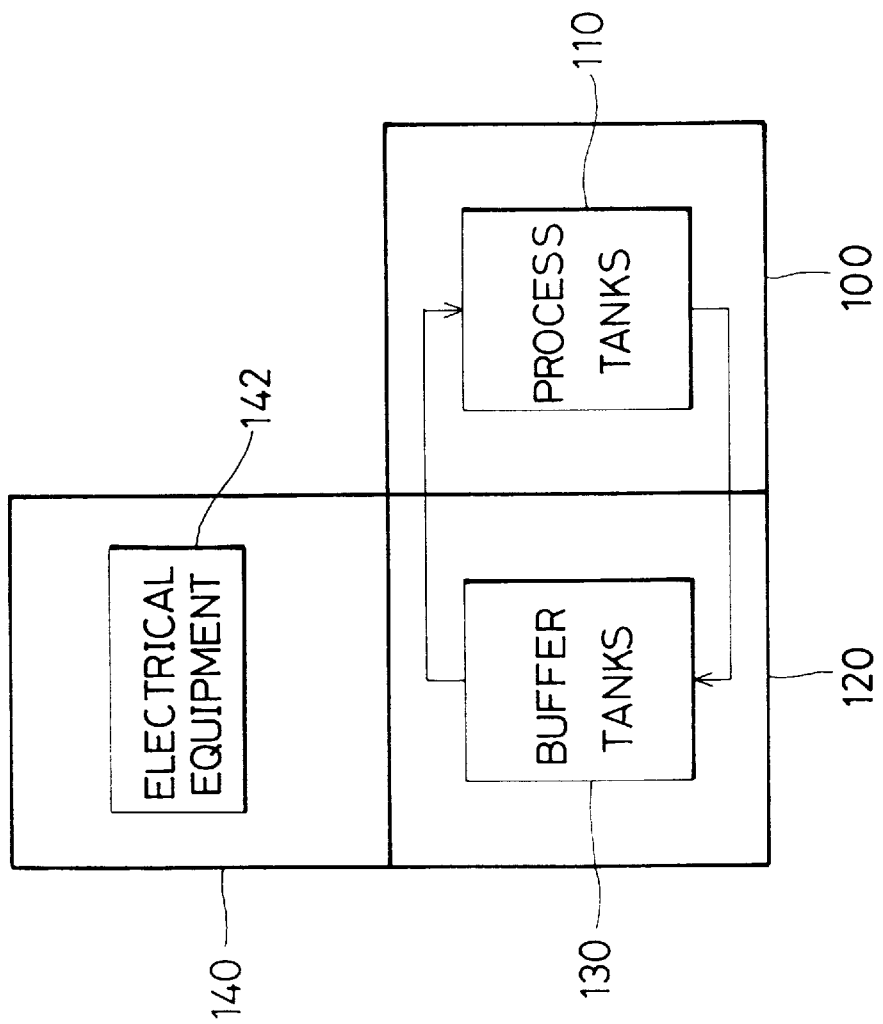
FIG. 2 is a layout of the preferred embodiment of a wet etching system according to the invention.

Referring to FIG. 2, it is the general layout of the wet etching system according to the invention, which includes a first cabinet 100 containing a process tank 110. A second cabinet 120 contains a buffer tank 130. A third cabinet 140 contains electrical equipment 142. Wafers are retained in the process tank 110. Chemical solution stored in buffer tank 130 is drawn into process tank 110 in order to react with the wafers for completing the wet etching and cleaning process.

Figure 3:
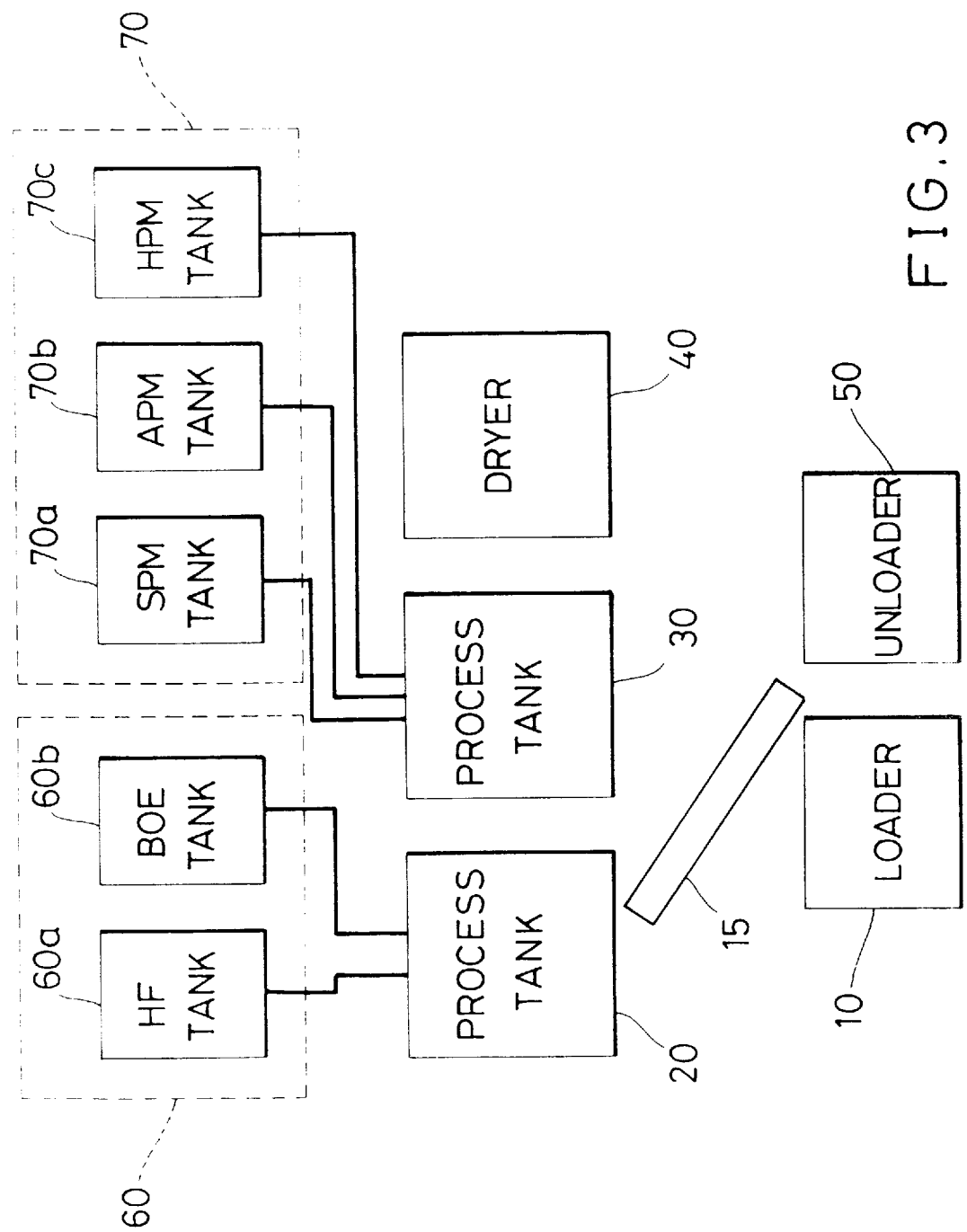
FIG. 3 is a detailed layout of the preferred embodiment of a cleaning and etching system according to the invention.

As shown in FIG. 3, the system includes a conventional loader 10, two process tanks 20 and 30, a dryer 40, an unloader 50, buffer tanks 60 for storing chemical solutions containing fluorine, and buffer tanks 70 for storing chemical solutions not containing fluorine. In use, first a wafer is loaded by the loader 10, and then the wafer is moved into the process tank 20 with a robot arm 15. A chemical solution with fluorine stored in buffer tank 60a, such as hydrofloric acid, is drawn into the process tank 20 to react with the wafer. After a predetermined period, the hydroflouric acid is drawn out. The wafer is then washed with deionized water. Then, another chemical solution for the next process step, such as a buffered oxide etchant (BOE), is drawn into the process tank 20 for etching the wafer. After the etching process is completed, the buffered oxide etchant is drawn out, and the wafer is washed with deionized water to remove chemical residue. The wafer then is moved with the robot arm 15 to another process tank 30. Chemical solutions not containing fluorine stored in buffer tanks 70, such as a mixture of sulfuric acid and hydrogen peroxide (SPM) stored in the buffer tank 70a, a mixture of ammonia and hydrogen peroxide (APM) stored in the buffer tank 70b, and a mixture of hydrochloric acid and hydrogen peroxide (HPM) stored in buffer tank 70c, are then sequentially drawn into the process tank 30. Then deionized water is drawn into the process tank 30 to wash the wafer and remove chemical residues. After being dried by the dryer 40, the wafer is removed by the unloader 50 with the robot arm 15.

Figure 4:
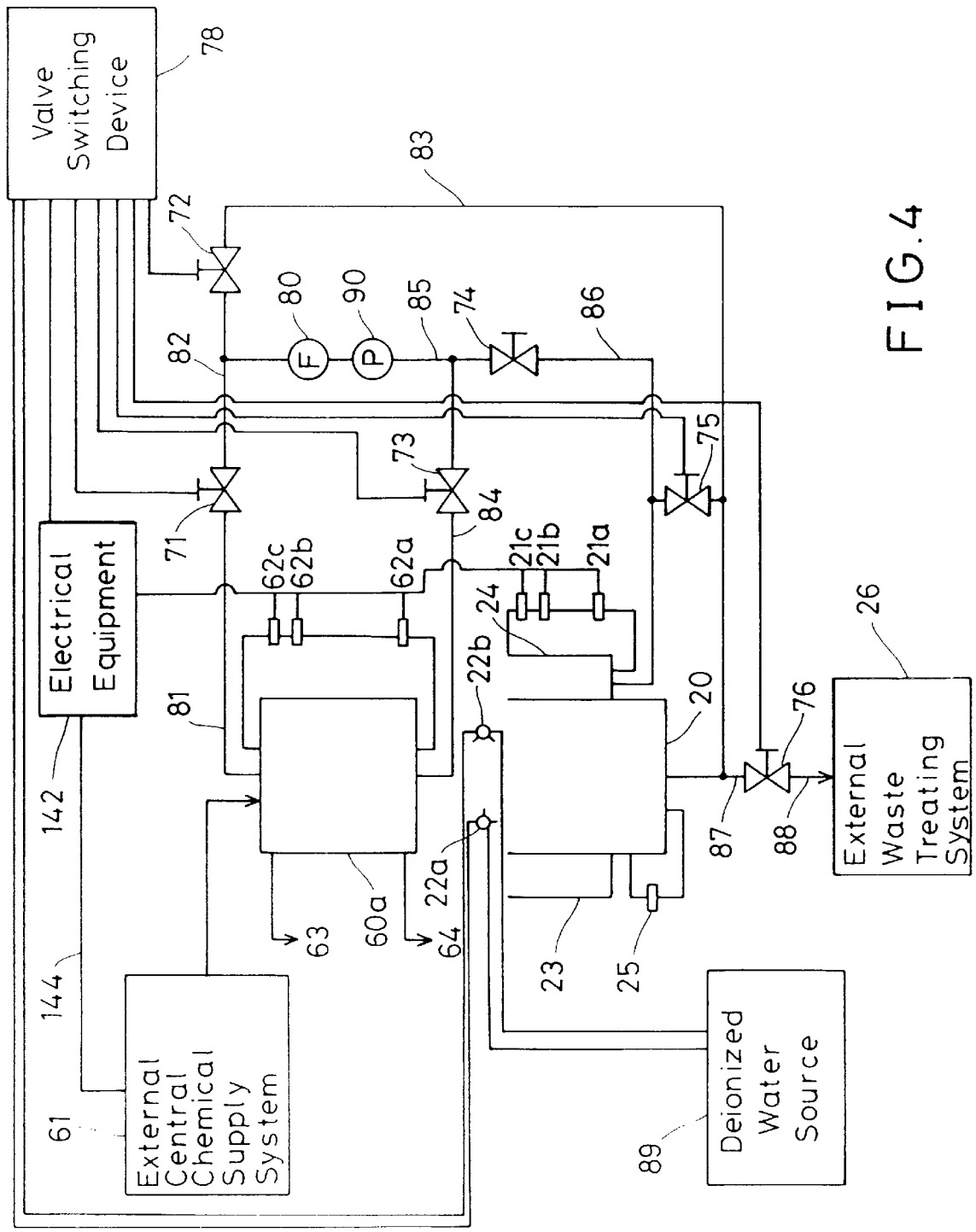
FIG. 4 is a layout illustrating the preferred embodiment of a wet etching system with buffer tanks and process tanks according to the invention.

FIG. 4 is a detailed layout of a buffer tank and a process tank according to the preferred embodiment of a wet etching system of the invention. Buffer tank 60a stores a chemical solution received from an external system 61. The buffer tank 60a has two conduits 63 and 64 to drain all or an overflow of the chemical solution. Three level sensors 62a, 62b, and 62c, electrically connected to the electrical equipment 142, which is connected by a line 144 to the external system 61, are used to detect the level of chemical solutions. Sensor 62a is a low level detector. When the chemical solution in the tanks 60a is lower than a predetermined low level, it will be detected by the sensor 62a. In response to such a detection, the external system 61, under the control of the electrical equipment, 142 sends more chemical solution into the buffer tank 60a. The sensors 62b and 62c are normal level and overflow level detectors respectively. The process tank 20 has a plurality of sensors 22a, 22b, 22c, and 25 which have the same functions as sensors 62a, 62b and 62c. The process tank 20 further includes an overflow tank 24 for receiving overflow of the chemical solution from process tank, and deionized water outlet ports 22a and 22b for outputting deionized water.

The system has a pump 90. A valve 71 is coupled with the buffer tank 60a through conduit 81. A valve 72 has one end coupled with the valve 71 through a conduit 82, and the other end coupled with the process tank 20 through a conduit 83. A valve 73 has one end coupled with the buffer tank 60a through a conduit 84, and the other end coupled with the conduit 82 between the valve 71 and the valve 72. A valve 74 has one end coupled with the valve 73 and the pump 90, and the other end coupled with the overflow tank 24. A valve 75 has one end coupled with a conduit 86, and the other end coupled with the conduit 83. A valve 76 has one end coupled with the conduit 83 through a conduit 87, and the other end coupled with an external waste treatment system through a conduit 88.

The buffer tank 60a stores a chemical solution supplied from external central chemical supply system 61. The amount of the chemical solution is controlled by sensors 62a through 62c. More precise control of the amount can be achieved by increasing the number of sensors. When chemical solution is supplied into the process tank 20, the valves 71, 74, 75, and 76 are "OFF", and the valves 72 and 73 are "ON". These valves are arranged so that they alternatively may be opened and closed by a valve switching device 78, under the control of the electrical equipment 42. Suitable control means in the electrical equipment for performing this and other control functions of the system would be well understood by persons skilled in the art and therefore are not further detailed here.

Chemical solution is driven by the pump 90 and drawn into the process tank 20 through the conduit 84, the conduit 85, the pump 90, the filter 80, the conduit 82, and the conduit 83. When the sensor 62a detects that the chemical solution is exhausted, the valve 73 is driven to close, for example by the switching device 78 under the control electrical equipment 142.

After the chemical solution has been drawn into the process tank 20, the valves 71, 73, 75, and 76 are "OFF", and the valves 72, and 74 are "ON". The overflow of the chemical solution from process tank 20b is into overflow tank 24, and is driven by the pump 90 to circulate back to process tank 20 through the conduit 86, the conduit 85, the pump 90, the filter 80, the conduit 82, and the conduit 83.

After chemical reactions are complete, recycling of the chemical solution is begun. Valves 72, 73, 75, and 76 are closed, and valves 71 and 74 are opened. The chemical solution in overflow tank 24 is driven by the pump 90 and drawn into the buffer tank 60a through the conduit 86, the conduit 85, the pump 90, the filter 80, the conduit 82, and the conduit 81. Then the valve 75 is turned "ON", and the chemical solution in the process tank 20 is drawn into the buffer tank 60a through the conduit 83, the conduit 86, the conduit 85, the pump 90, the filter 80, the conduit 82, and the conduit 81 to recycle chemical solution. If the chemical solution is not to be recycled, it can be drained out to an external waste treatment system 26 through the conduit 87 and the conduit 88, by opening the valve 76. After that, deionized water from a deionized water source is output from the deionized water outlet ports 22a and 22b to remove chemical residue on the wafer, which completes the etching and cleaning process.

To increase the purity of the chemical solution, before processing the wafers, the valves 71 and 73 are turned "ON" and other valves turned "OFF", so that the chemical solution is driven by the pump 90 to be filtered through the filter 80, the pump 90, the conduit 84, the conduit 85, the conduit 82, and the conduit 81.

The buffer tank 61b together with corresponding conduits, valves, pumps, overflow tanks, deionization water outlet ports, sensors, and filters are similarly provided and connected to the process tanks 20, the external system 61, the electronic equipment 142, the valve switching device 78, and the inlet of valve 76, so as to function in the same manner. Similarly, the process tank 30 is substantially the same as the process tank 20 and the buffer tanks 70a–70c, and respective conduits, valves, pump, overflow tanks, deionized water outlet ports, sensors, and filters are similar to the buffer tanks 60a–60c and corresponding conduits, valves, pump, overflow tanks, deionized water outlet ports, sensors, and filters, and are similarly connected to the process tank 30, the external system 61, the electrical equipment 142, and the valves 76.

While the invention has been described by way of example and in terms of a preferred embodiment, it is to be understood that the invention is not limited to the disclosed embodiment. To the contrary, it is intended to cover various modifications and similar structures and arrangements, and the appended claims should be accorded the broadest interpretation so as to encompass all such modifications and similar structures and arrangements.

What is claimed is:

1. A system for cleaning and etching a wafer, the system receiving a chemical solution from an external system, and discharging used chemical solution through an external waste treating system, the system comprising:

a loader for loading the wafer;

a buffer tank for storing the chemical solution received from the external system;

a plurality of first sensors for detecting the amount of the chemical solution stored in the buffer tank;

a chemical flow system for controlling the amount of the chemical solution stored in the buffer tank;

a process tank, including a tank body for retaining the loaded wafer and receiving the chemical solution from said buffer tank;

a plurality of second sensors for detecting the amount of the chemical solution in the tank body;

at least one overflow tank for receiving overflow of the chemical solution from said tank body;

means for providing deionized water to the tank body; and a pump;

wherein said chemical flow system includes a first valve, a second valve, a third valve, a fourth valve, a fifth valve, a sixth valve, a first conduit, a second conduit, a third conduit, a fourth conduit, a fifth conduit, a sixth conduit, a seventh conduit, and an eighth conduit, said first valve being coupled to said buffer tank through said first conduit, a first end of said second valve being coupled to said first valve through said second conduit, a second end of said second valve being coupled to said process tank through said third conduit, a first end of said third valve being coupled to said buffer tank through said fourth conduit, a second end of said third valve being coupled to said fifth conduit between said fourth valve and said pump said fifth conduit being coupled to a first end of said fourth valve and to said second conduit between said first valve and said second valve, and said pump being located within said fifth conduit, a second end of said fourth valve being coupled to said overflow tanks of said process tank via said sixth conduit, said fifth valve coupling said sixth conduit to said third conduit, a first end of said sixth valve being coupled to said third conduit through said seventh conduit, and a second end of said sixth valve being coupled to the external waste treating system through said eighth conduit.

2. A system according to claim 1, further comprising means for maintaining said first valve, said fourth valve, said fifth valve, and said sixth valve closed, and said second valve and said third valve opened, when the wafer is retained in said process tank, so that the chemical solution is drawn into said process tank by said pump through said fourth conduit, said fifth conduit, and said third conduit;

and for maintaining said first valve, said third valve, said fifth valve, and said sixth valve closed, and said second valve and said fourth valve opened, after the chemical solution has been drawn into said process tank so that the overflow of the chemical solution from said process tank flows into said overflow tank, and the overflow of the chemical solution in said overflow tank is drawn into said process tank by said pump through said sixth conduit, said fifth conduit, said second conduit, and said third conduit.

3. A system according to claim 2, further comprising means for maintaining said second valve, said third valve, said fifth valve, and said sixth valve closed, and said first valve and said fourth valve opened, after a predetermined period, after the overflow is drawn into the process tank, so that the chemical solution in said overflow tanks is drawn back to said buffer tank by said pump through said sixth conduit, said fifth conduit, said second conduit, and said first conduit;

means for then maintaining said fifth valve open, so that the chemical solution is said process tank is drawn back to said buffer tank by said pump through said third conduit, said sixth conduit, said fifth conduit, said second conduit, and said first conduit; and means for then outputting deionized water through deionized water outlet ports to remove residue of the chemical solution on the wafer.

4. A method of cleaning and etching a wafer, with an apparatus which receives a chemical solution from an external system and discharging used chemical solution through an external waste treating system, the apparatus including: a loader for loading the wafer; a buffer tank for receiving and storing the chemical solution from the external system, the buffer tank including a plurality of first sensors for detecting the amount of the chemical solution in the buffer tank and a chemical flow system for controlling the amount of the chemical solution in the buffer tank; a process tank, including a tank body for retaining the loaded wafer and receiving the chemical solution in the tank body from the buffer tank, a plurality of second sensors for detecting the amount of the chemical solution in the tank body, and overflow tank for receiving overflow of the chemical solution from the tank body, and a plurality of deionized water outlet ports for outputting deionized water; and a pump, wherein said chemical flow system includes a first valve, a second valve, a third valve, a fourth valve, a fifth valve, a sixth valve, a first conduit, a second conduit, a third conduit, a fourth conduit, a fifth conduit, a sixth conduit, a seventh conduit, and an eighth conduit, the first valve being coupled with the buffer tank through the first conduit, one end of the second valve being coupled with the first valve through the second conduit, the other end of the second valve being coupled with the process tank through the third conduit, one end of the third valve being coupled with the buffer tank through the fourth conduit, the other end of the third valve being coupled with the fifth conduit between the fourth valve and said pump, the fifth conduit being coupled to one end of the fourth valve and to the second conduit between the first valve and the second value, and the pump being located within the fifth conduit, the other end of the fourth valve being coupled with said overflow tanks of the process tank via the sixth conduit, the fifth valve coupling the sixth conduit with the third conduit, one end of the sixth valve being coupled with the third conduit through the seventh conduit, the other end of the sixth valve being coupled with the external waste treating system through the eighth conduit, the method comprising:

retaining the wafer in the process tank;

closing the first valve, the fourth valve, the fifth valve, and the sixth valve and opening the second valve and the third valve;

drawing the chemical solution into the process tank by the pump through the fourth conduit, the fifth conduit, and the third conduit;

after the chemical solution has been drawn into the process tank, causing the chemical solution to flow into the overflow tank with the first valve, the third valve, the fifth valve, and the sixth valve closed, and the second valve and the fourth valve opened; and drawing the overflow of the chemical solution in the overflow tank into the process tank by the pump through the sixth conduit, the fifth conduit, the second conduit, and the third conduit.

5. A method according to claim 4, further comprising: after a predetermined period after said step of drawing the overflow, closing the second valve, the third valve, the fifth valve, and the sixth valve, and opening first valve and the fourth valve;

drawing the chemical solution in the overflow tanks back to the buffer tank by the pump through the sixth conduit, the fifth conduit, the second conduit, and the first conduit;

opening the fifth valve;

drawing the chemical solution stored in said process tank back to the buffer tank by the pump through the third conduit, the sixth conduit, the fifth conduit, the second conduit, and the first conduit; and inputting deionized water to the process tank through the deionized water outlet ports to remove residue of the chemical solution on the wafer.

* * * * *